Jan. 21, 1969 H. E. HEATH ET AL 3,423,260

METHOD OF MAKING A THIN FILM CIRCUIT HAVING A RESISTOR-CONDUCTOR PATTERN

Filed March 21, 1966

INVENTORS
HERBERT E. HEATH
CLYDE W. SKAGGS
BY Arthur Freilich
ATTORNEY

United States Patent Office 3,423,260
Patented Jan. 21, 1969

3,423,260
METHOD OF MAKING A THIN FILM CIRCUIT HAVING A RESISTOR-CONDUCTOR PATTERN

Herbert E. Heath and Clyde W. Skaggs, Canoga Park, Calif., assignors to The Bunker-Ramo Corporation, Stamford, Conn., a corporation of Delaware Filed Mar. 21, 1966, Ser. No. 535,891
U.S. Cl. 156—3 4 Claims
Int. Cl. H01b *5/14;* C23f *1/02*

ABSTRACT OF THE DISCLOSURE

A method of fabricating a thin film circuit comprised of a composite resistor-conductor pattern. The method includes the steps of (1) depositing a resistive film on a substrate; (2) etching the resistive film to define the desired composite pattern; (3) depositing a layer of isolating material over said resistive film to protect the resistive film from contamination by a conductive film which is applied over the isolating material; and (4) separately etching the layers of isolating material and conductive film in the resistor areas of the pattern.

This invention relates generally to thin film circuits and more particularly to a structural configuration and fabrication method therefor which enables the electrical characteristics of thin film components to be very accurately controlled.

The utility of thin film circuit structures has been discussed at length in the literature. Moreover, various techniques for fabricating such structures have also been discussed in great detail; e.g., (1) "Photo-etching Thin-Film Circuits," by C. W. Skaggs, vol. 37, No. 18, Electronics, June 15, 1964, and (2) "Thin Film Process Technology and Reliability," by J. W. Ireland and D. L. Fresh, vol. XX, October, 1964, Proceedings of the National Electronics Conference.

Generally, thin film circuits comprised or resistors, for example, are fabricated by initially placing (e.g., by vacuum deposition) a layer of resistive material on a dielectric substrate. Secondly, a layer of conductive material is deposited over the resistive material. The layers are then selectively etched to form the resistors and conductors in the desired pattern on the substrate.

As discussed in the previously cited reference (2), the conductive material usually comprises gold or some combination including gold. The resistive material usually comprises chromium or some nickel-chromium alloy such as Chromel-C or Cermet. The electrical characteristics of these resistive materials are summarized by the following table:

| Material | Resistance (ohms/square) | Temp. coef. (p.p.m./° C.) | Tolerance (percent) |
|---|---|---|---|
| Chromel-C | 25-500 | −25–+25 | ±0.01 |
| Chromium | 25-500 | −250-0 | ±0.1 |
| Cermet | 100-10,000 | −500–−50 | ±0.25 |

From the foregoing table, it should be appreciated that Chromel-C is to be preferred for use in circuits in which the resistance values and temperature coefficient of resistance have to be controlled to extremely close tolerances. It has unfortunately been found, however, that gold deposited directly over a nickel-chromium alloy, such as Chromel-C or Cermet or other combinations of a ceramic material (e.g., silicon monoxide) and a metal (e.g., chromium), contaminates the alloy, thus destroying the predictability of its temperature coefficient of resistance. In order to avoid this, the usual prior art technique for fabricating a circuit employing gold conductive material and a nickel-chromium alloy resistance material has involved depositing each of the desired conductor patterns through a separate mechanical mask, rather than forming the pattern by etching after deposition. Techniques requiring the use of mechanical masks are usually very much slower, more complex, and less reliable than etching techniques in which the undesired deposited material is removed after deposition.

In view of the foregoing, the present invention is directed to improved thin film structures and a method of fabrication thereof, which enables the electrical characteristics of the thin film components to be very accurately controlled.

Briefly, the present invention is based upon the recognition that contamination and the resulting variation of the electrical characteristics of a nickel-chromium alloy resistance layer, by a conductive material such as gold deposited thereover, can be avoided by inserting an isolation layer, e.g., chromium, therebetween.

Thus, in accordance with a preferred embodiment of the present invention, a thin film circuit is fabricated by initially covering a dielectric substrate with a layer of resistance material, such as Chromel-C. Selected portions of the Chromel-C are then removed, leaving Chromel-C defining a composite resistor-conductor pattern. Subsequently, a layer of chromium and then a layer of gold are deposited over the entire substrate surface including the resistor-conductor pattern. Then, the gold is etched away to define only the desired conductor pattern. Thereafter, the isolation layer, i.e., the chromium, is etched away to also define the desired conductor pattern.

The novel features that are considered characteristic of this invention are set forth with particularity in the appended claims. The invention itself will best be understood from the following description when read in connection with the accompanying drawings, in which:

Figures 1, 2, 3, 4, 5, 6, 7, 8, 9, 10, 11:
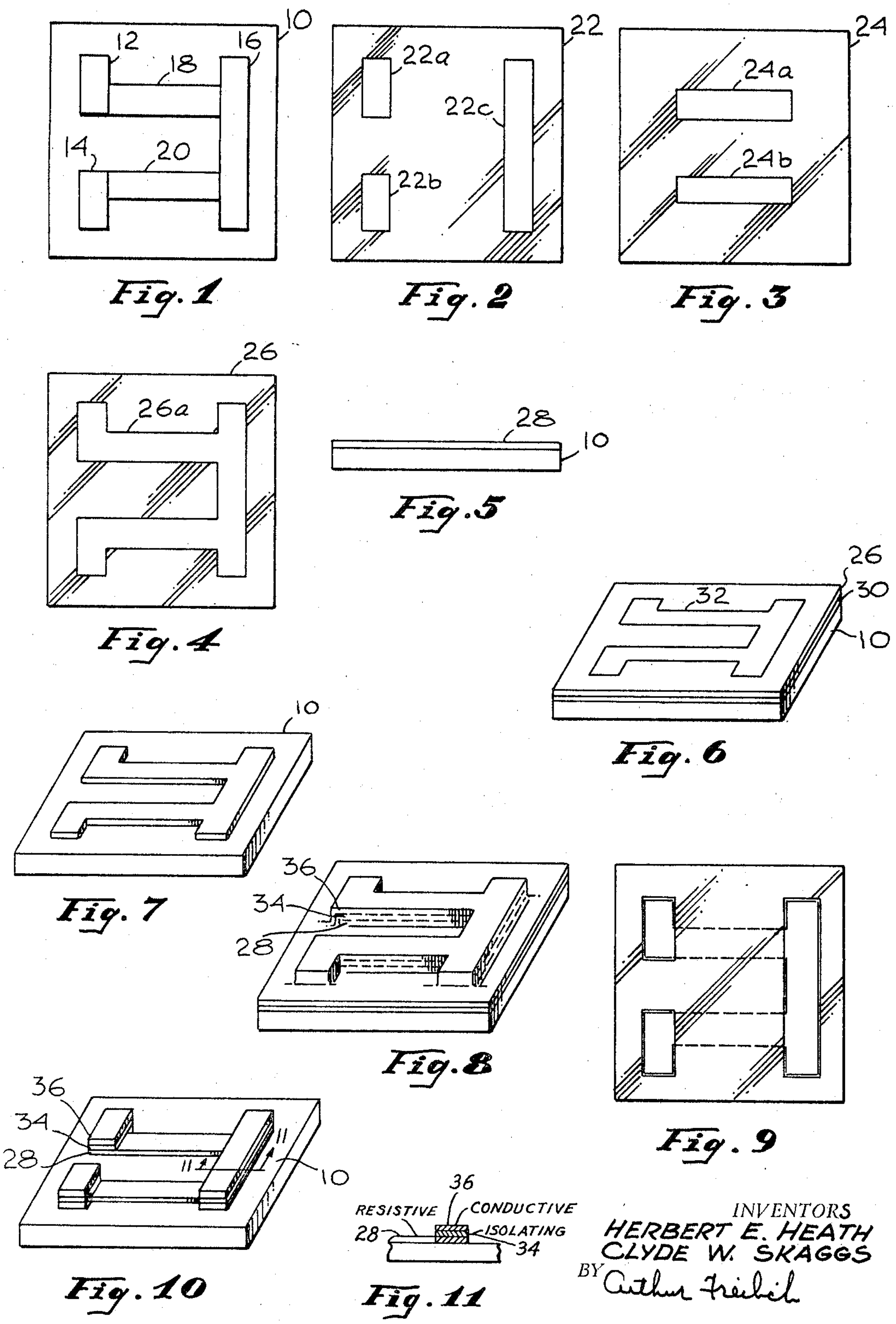
FIGURE 1 is a plan view of a simplified thin film network.
FIG. 2 is a plan view of a photo negative of a desired conductor pattern.
FIG. 3 is a plan view of a photo negative of a desired resistor pattern.
FIG. 4 is a plan view of a photo negative of a composite resistor-conductor pattern.
FIG. 5 is a side sectional view illustrating a layer of resistive material on a substrate.
FIG. 6 is a diagrammatic illustration showing a developed photoresist pattern on the resistive material of FIG. 5.
FIG. 7 is a perspective view illustrating the layer of resistive material of FIG. 6 etched to define the composite resistor-conductor pattern.
FIG. 8 is a perspective view illustrating a subsequent step in the fabrication method showing isolation and conductive layers applied over the substrate of FIG. 7.

FIG. 9 schematically illustrates a photoresist exposed by the photo negative of the conductor pattern;

FIG. 10 is a perspective view illustrating a thin film circuit board after fabrication has been completed; and FIG. 11 is a sectional view taken substantially along the plane 11—11 of FIG. 10.

In the drawings, the thicknesses of the layers of resistive and conductive material are shown greatly exaggerated for purposes of illustration. It is understood that in actual practice the layers are exceedingly thin. Furthermore, the resistor-conductor network shown in the drawings is exceedingly simple in its configuration, this being done for clarity of illustration and explanation.

In the following description, reference will be made to exposing a photoresist through a photographic negative. When the photoresist is developed, it hardens in those areas where it has been exposed to provide a positive resist image of the photographic negative. Such a photoresist, known as KTFR, is manufactured and sold by Eastman Kodak Company, Rochester, New York. However, another type of photoresist is manufactured and sold by the Shipley Company, Incorporated, Wellesley, Massachusetts. The latter type, when exposed and developed, hardens in the unexposed areas. Therefore, such a photoresist would be exposed through a photographic positive rather than through a photographic negative to provide a positive resist image of the photographic positive. The method of the invention contemplates the use of either type of photoresist. Although the use of KTFR will be assumed herein, it should be understood that, if the other type of photoresist is used, the terms "photographic negative" and "photographic positive" should be interchanged in the following description.

FIG. 1 illustrates a simple, thin film resistor-conductor network carried on an insulating substrate 10 and comprising three conductors 12, 14, and 16 and two resistors 18 and 20. In accordance with a preferred embodiment of the invention, the thin film network of FIG. 1 can be fabricated by a photo etching process. Such a process requires that separate sharp photographic negatives of the conductor pattern and the resistor pattern, respectively, be provided. Such negatives, respectively designated 22 and 24, are illustrated in FIGS. 2 and 3. It will be noted that the negative 22 is completely opaque except for areas *22a*, *22b*, and *22c*, which respectively correspond to the conductors 12, 14, and 16 in the desired thin film network shown in FIG. 1. Similarly, the negative 24 is completely opaque except for clear areas *24a* and *24b* which respectively correspond to the resistors 18 and 20 of FIG. 1. The negatives 22 and 24 may be made by conventional photographic techniques from larger diagrams of the circuit.

The negatives 22 and 24 are utilized to form a composite photographic negative 26 shown in FIG. 4. The negative 26 is completely opaque except for the clear area *26a*, which, as can be seen, is a composite of the conductor and resistor patterns respectively defined by the negatives 22 and 24. The negative 26 can, of course, be formed from the negatives 22 and 24 by conventional photographic techniques.

In accordance with a preferred method of practicing the invention, the substrate 10, which is formed of a dielectric material such as alumina or glass, is covered with a resistive material 28 which can comprise a nickel-chromium alloy, such as Chromel-C or Cermet. Where very close tolerances are desired, Chromel-C is to be preferred, as indicated by the table of characteristic set forth above.

Preferably, the resistive material 28 will be applied to the substrate 10 by vacuum deposition in the manner discussed in the aforecited references. After the resistive material 28 has been applied to the substrate, it is coated with a photoresist 30 and then exposed through the resistor-conductor composite negative 26. Consequently, an area 32 will harden and therefore be resistant to the subsequently applied etchant. More particularly, the unexposed portions of the photoresist will wash off when developed and allow the Chromel-C to be etched by applying concentrated hydrochloric acid at an elevated temperature of 50° C. As a consequence, the unprotected resistive material will be removed to leave Chromel-C defining the composite resistor-conductor pattern, as shown in FIG. 7.

Subsequently, an isolating layer 34, such as chromium, is applied to the substrate 10 covering the remaining resistive material. After the chromium is applied, a conductive material 36, such as gold, is applied over the chromium. The chromium and gold can be applied by vacuum deposition in a single pump-down of the vacuum equipment. FIG. 8 illustrates the chromium and gold layers deposited over the resistive material defining the composite resistor-conductor pattern.

Subsequently, a photoresist is applied over the gold and then exposed through the conductor negative 22 shown in FIG. 2. The gold conductive material is then etched using a commercial gold stripper, thereby leaving gold only in the desired conductor areas. The chromium is then etched by using concentrated hydrochloric acid at room temperature. In addition, it is of assistance to contact the edge of the substrate 10 with an aluminum member, such as a piece of wire, while the structure is in the hydrochloric acid. Characteristically, Chromel-C is not a continuous sheet and is practically insoluble in hydrochloric acid at room temperature. On the other hand, the chromium characteristically is a continuous sheet and will etch by propagation. As a consequence, the chromium is removed without damaging the electrical characteristics of the Chromel-C. As mentioned in the aforecited reference (1), since aluminum is above chromium in the electromotive series and since both aluminum and chromium are soluble in hydrochloric acid, the aluminum ions replace the chromium ions in solution, thereby stripping the chromium from the substrate in the unprotected areas.

From the foregoing, it should be appreciated that a photo etching method has been disclosed herein for fabricating a thin film circuit structure which can employ Chromel-C as the resistive material and gold as the conductive material without contaminating the Chromel-C and thus destroying the predictability of its electrical characteristics. Although it does appear that the specific materials mentioned herein are to be preferred where very high precision and a low value temperature coefficient of resistance are desired, it should be recognized that the teachings of the invention can be equally applicable to other materials where it is desired to prevent the conductive material from contaminating the resistive material. For example, copper can similarly be isolated from the Chromel-C in accordance with the invention. The teachings of the invention are also applicable to techniques for fabricating capacitors where it is desired to use a high activation energy material such as gold and it is necessary to isolate the gold from the dielectric material to prevent penetration of the dielectric by the gold.

The embodiments of the invention in which an exclusive property or privilege is claimed are defined as follows:

1. A method of forming a thin film circuit comprised of resistors and conductors on a dielectric substrate so as to permit selective etching techniques to be used for providing both the resistor and conductor patterns even though the resistive material is subject to being contaminated by the conductive material, said method comprising the steps of:

- applying to said substrate a layer of a nickel-chromium alloy resistive material;
- convering said layer of resistive material with a first photoresist;
- exposing said first photoresist through an image bearing transparency optically defining a desired composite resistor-conductor pattern including resistor and conductor areas;
- etching said layer of resistive material to leave portions thereof coincident with said desired composite resistor-conductor pattern;
- applying successive layers of isolating material of chromium and conductive material of gold over the entire substrate and covering the remaining portions of said resistive material;
- covering said layer of conductive material with a second photoresist;
- exposing said second photoresist through an image bearing transparency optically defining a desired conductor pattern for conductive interconnection of resistive portions in accordance with said circuit; and
- etching those portions of said layers of isolating and conductive material coinciding with unexposed portions of said second photoresist to provide a desired conductor pattern in accordance with said circuit.

2. The method of claim 1 wherein said steps of applying said resistive, isolating, and conductive materials comprises depositing such layers by vacuum deposition.

3. The method of claim 1 wherein said step of etching said layers of isolating and conductive material includes the steps of initially etching said conductive material and secondly etching said isolating material.

4. The method of claim 1 wherein said step of etching said isolating material includes the steps of applying room temperature concentrated hydrochloric acid to said isolating material; and contacting said substrate with an aluminum member.

References Cited

UNITED STATES PATENTS

| | | | |
|---|---|---|---|
| 1,904,241 | 4/1933 | Kammerer | 174—126 |
| 2,662,957 | 12/1953 | Eisler. | |
| 2,786,925 | 3/1957 | Kahan | 338—308 XR |
| 3,061,911 | 11/1962 | Baker | 338—309 XR |
| 3,284,683 | 11/1966 | Riezh | 317—258 |

JACOB H. STEINBERG, *Primary Examiner.*

U.S. Cl. X.R.

156—11; 174—68.5, 126.2; 317—101; 338—108; 29—620; 96—36.2